United States Patent
Jang

(10) Patent No.: US 6,724,575 B1
(45) Date of Patent: Apr. 20, 2004

(54) METHOD AND APPARATUS FOR PROVIDING FLEX CABLE CONDUCTOR WITH ELLIPTICAL CROSS-SECTION

(75) Inventor: Eunkyu Jang, Santa Clara, CA (US)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 09/713,963

(22) Filed: Nov. 15, 2000

(51) Int. Cl.$^7$ ................................. G11B 5/48
(52) U.S. Cl. ................................. 360/245.9
(58) Field of Search .............. 360/245.9, 246

(56) References Cited

U.S. PATENT DOCUMENTS

| | | | |
|---|---|---|---|
| 5,055,969 A | 10/1991 | Putnam | |
| 5,245,489 A | * 9/1993 | Kimura | 360/245.9 |
| 5,422,764 A | 6/1995 | McIlvanie | |
| 5,499,161 A | 3/1996 | Hosseinzadeh et al. | |
| 5,532,889 A | 7/1996 | Stefansky et al. | |
| 5,583,720 A | 12/1996 | Ishida et al. | |
| 5,737,837 A | 4/1998 | Inaba | |
| 5,757,582 A | 5/1998 | White et al. | |
| 5,760,997 A | 6/1998 | Koyanagi et al. | |
| 6,078,473 A | 6/2000 | Crane et al. | |
| 6,172,854 B1 | * 1/2001 | Iwamoto | 360/245.9 |
| 6,195,034 B1 | * 2/2001 | Tsuno et al. | 342/1 |
| 6,326,553 B1 | 12/2001 | Yim et al. | |

* cited by examiner

*Primary Examiner*—A. J. Heinz
(74) *Attorney, Agent, or Firm*—Irell & Manella LLP; Jeffrey P. Aiello

(57) ABSTRACT

The present invention is a method and apparatus for providing an electrical substrate. The electrical substrate comprises a dielectric layer; and a first conductive layer attached to the dielectric layer, in which the first conductive layer has an elliptical cross-section. The electrical substrate may be used in a flexible circuit that connects the read/write head to electronic circuitry in a hard disk drive.

11 Claims, 4 Drawing Sheets

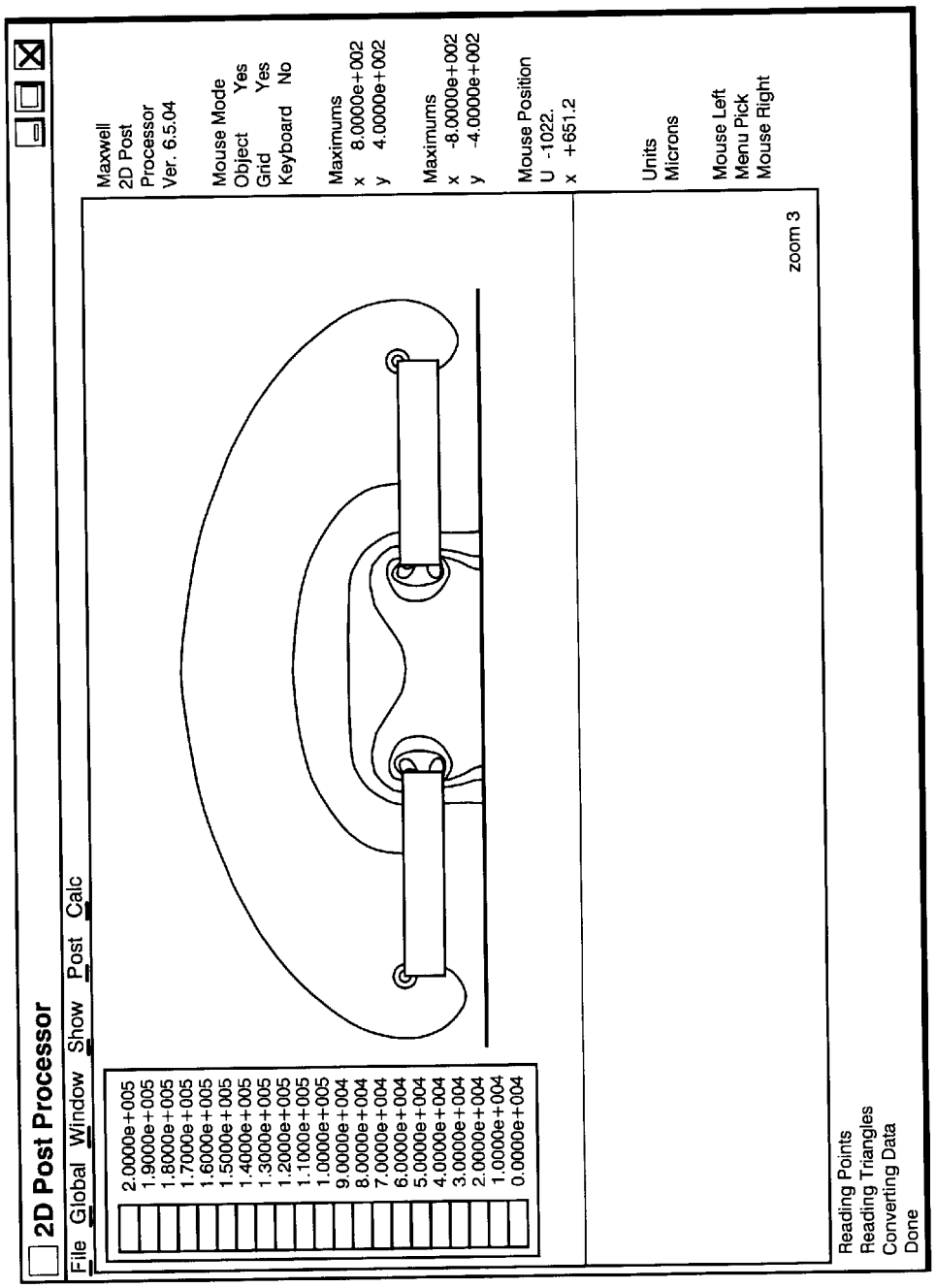
FIG. 2 (PRIOR ART)   ELECTRIC FIELD OF RECTANGULAR SHAPE CONDUCTORS

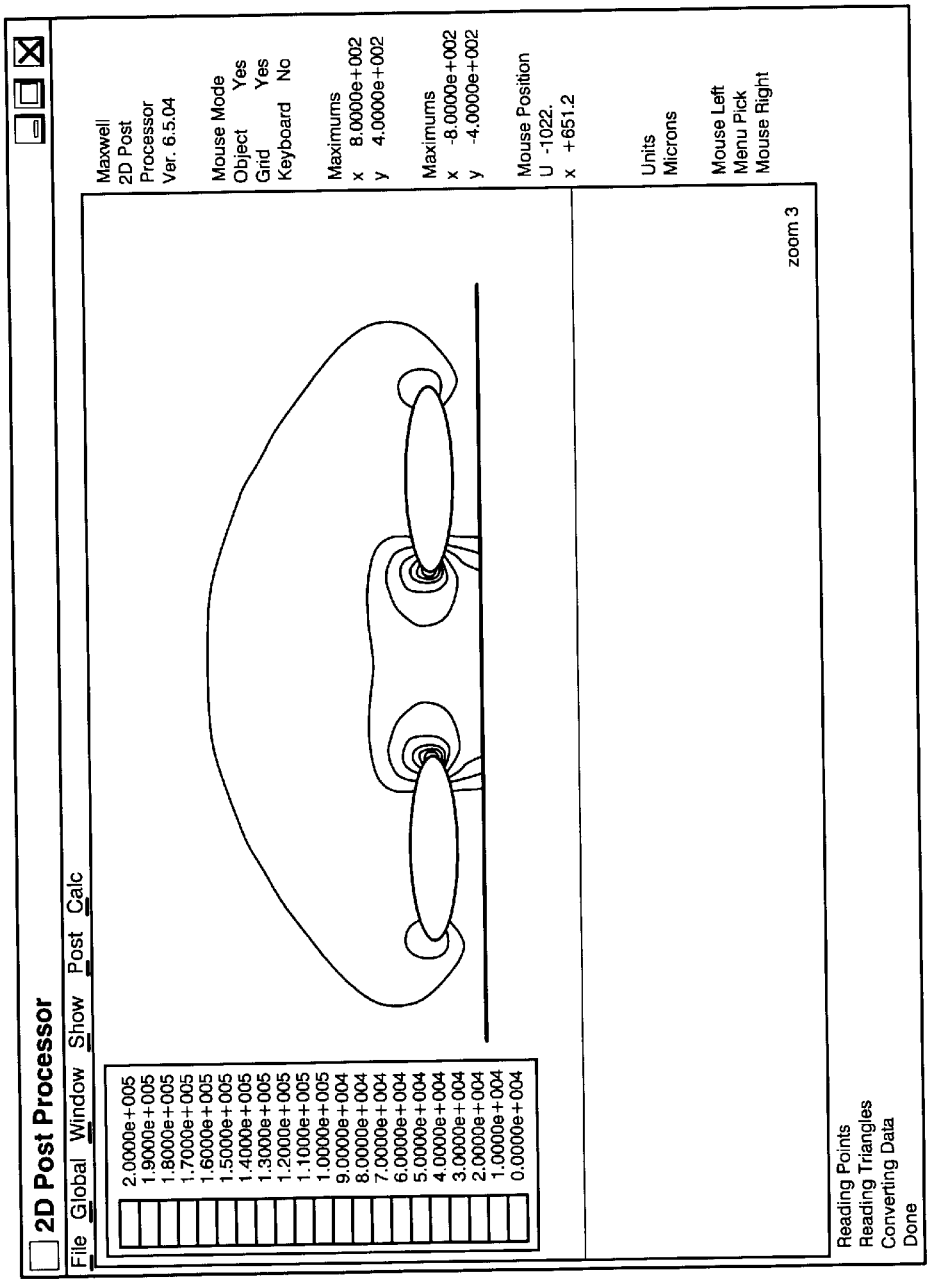
FIG. 5    ELECTRIC FIELD OF ELLIPTICAL SHAPE CONDUCTORS

METHOD AND APPARATUS FOR PROVIDING FLEX CABLE CONDUCTOR WITH ELLIPTICAL CROSS-SECTION

BACKGROUND OF THE INVENTION

1. Field of the Invention

The present invention relates in general to magnetic recording heads and more particularly, a method and apparatus for providing a flexible cable conductor for a magnetic recording head that has an elliptical cross section.

2. Description of the Background

Hard disk drives contain a number of magnetic recording heads that magnetize and sense the magnetic fields of a rotating magnetic disk. The recording heads are integrated into a slider that is attached to a gimbal of a flexure arm to form an assembly commonly referred to as a head gimbal assembly (HGA). The flexure arms are rotated by a voice coil motor. The voice coil motor is excited with a current to rotate the actuator and move the heads.

The recording head is typically attached to the voice coil motor by one or more interconnecting conductors. These conductors are typically located on a flexible cable or as provided as wires. The design of the conductor is important because it directly affects the data rate of the hard disk drive.

Accordingly, there is a need in the technology for providing a recording head having well designed interconnecting conductors, so as to optimize the data rate provided by a hard disk drive.

BRIEF SUMMARY OF THE INVENTION

The present invention is a method and apparatus for providing an electrical substrate. The electrical substrate comprises a dielectric layer; and a first conductive layer attached to the dielectric layer, in which the first conductive layer has an elliptical cross-section. The electrical substrate may be used in a flexible circuit that connects the read/write head to electronic circuitry in a hard disk drive.

BRIEF DESCRIPTION OF THE DRAWINGS

FIG. 2 illustrates the electric field distribution of the conductor of FIG. 1.

FIG. 5 illustrates the electrical field distribution of the conductor of FIG. 4.

DETAILED DESCRIPTION OF THE INVENTION

Figure 1:
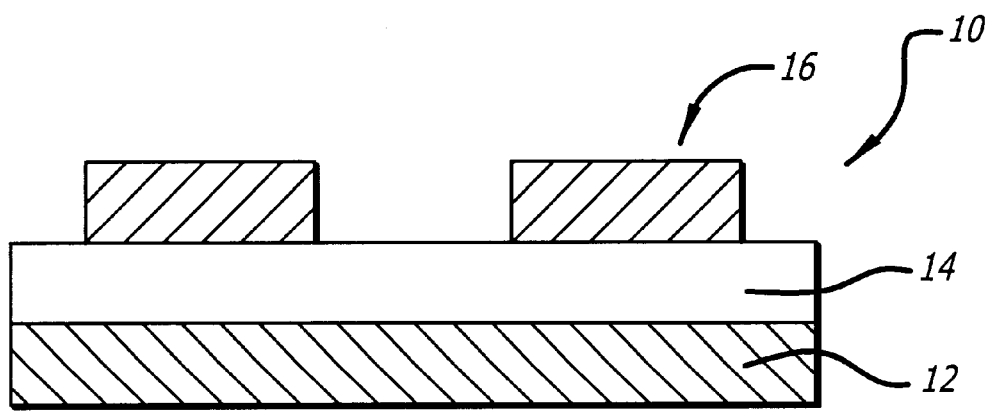
FIG. 1 illustrates a cross section of a conductor in a wireless suspension of the prior art.

Recording heads are typically connected to the preamplifier of a voice coil motor using interconnecting conductors that are located on a flexible cable. As shown in FIG. 1, an interconnecting conductor 10 typically comprises a ground plane 12, an insulating layer 14 and a trace layer 16. The trace layer provides an electrical connection between the head and a preamplifier in the voice coil motor.

Currently, the cross section of the trace layer 16 in the interconnecting conductor is rectangular in shape. Analysis of such an interconnecting conductor revealed that there is a concentration of electric fields around the corners of the trace element, as shown in FIG. 2. The distortion of the electric fields around the corners of the trace element results in interference of the signal being transmitted.

Figure 3:
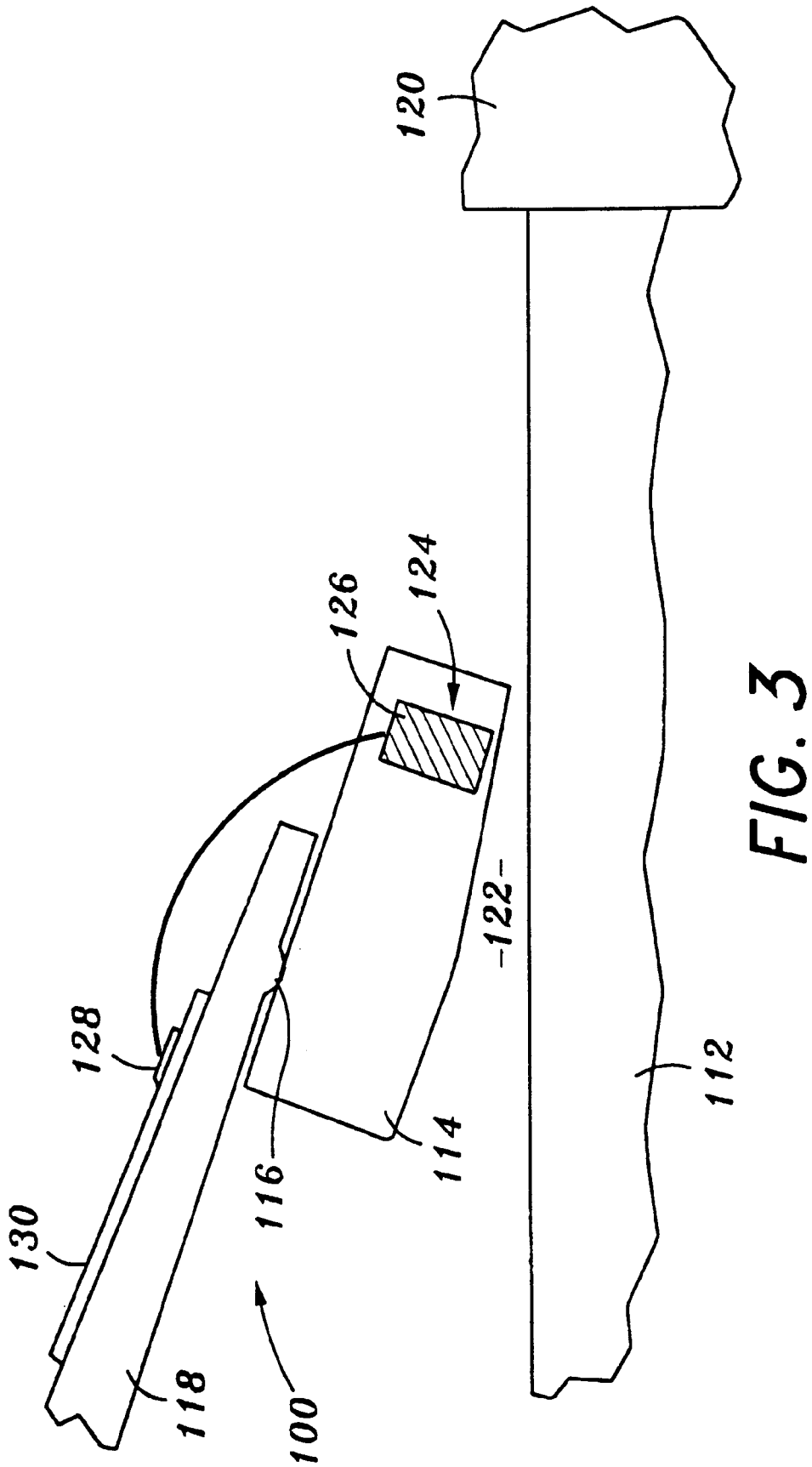
FIG. 3 is a side view showing a head gimbal assembly flying adjacent to a rotating magnetic disk.

FIG. 3 illustrates an apparatus 100 that implements the interconnecting conductor of the present invention. The apparatus 100 includes a head gimbal assembly (HGA) 110 which is located adjacent to a magnetic disk 112. The HGA 110 includes a slider 114 that is mounted to a gimbal 116 of a flexure arm 118. The flexure arm 18 is attached to an actuator arm (not shown) which has a voice coil motor that can move the slider 114 across the surface of the disk 112. The disk 112 is rotated by a spin motor 120. The rotation of the disk 120 creates an air flow that cooperates with hydrodynamic features of the HGA 110 to create an air bearing 122 between the slider 114 and the disk surface.

An inductive magnetic recording head 124 is integrated into the slider 114 to magnetize and sense a magnetic field(s) of the disk 112. Movement of a magnetized disk will create a time-varying magnetic field that will provide an output voltage across the coil assembly 126 as is known in the art. Likewise, the disk 112 can be magnetized by varying the current that flows through the coil 126. The coil assembly 126 contains coils that are each attached to leads that extend from the head 124. The leads are typically connected to terminal pads 128 of a flexible circuit 130 that is mounted to the flexure arm 118 of the HGA 110. The flexible circuit 130 contains conductive traces that connect the head 124 to electronic circuitry (such as a voice coil motor) of a hard disk drive. Details of such a flexible circuit 148 are discussed below.

Figure 4:
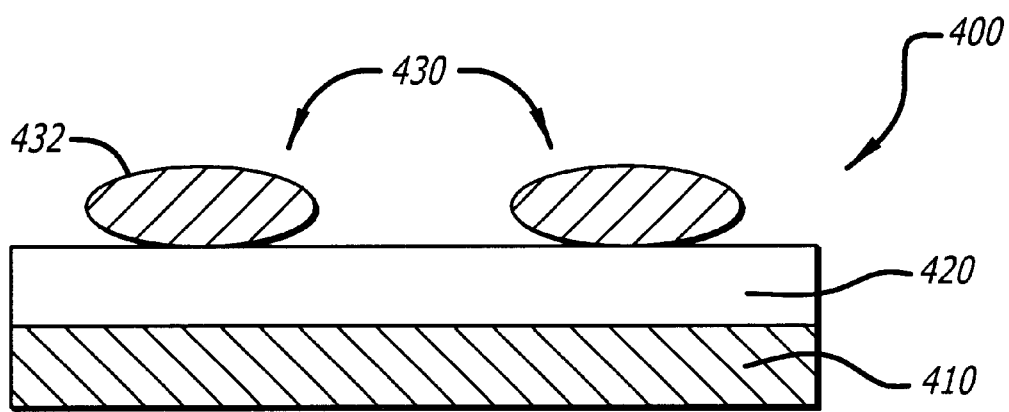
FIG. 4 illustrates a cross section of one embodiment of a conductor with an elliptical cross section provided in accordance with the principles of the invention.

FIG. 4 illustrates one embodiment of the interconnecting conductor 400 of the invention. In particular, FIG. 4 illustrates the cross-section of an interconnecting conductor 400, such as the flexible circuit 130 discussed above. The interconnecting conductor 400 comprises a ground plane 410, an insulating layer 420 and a trace layer having an elliptical cross sectional area 432. In one embodiment, the insulating layer 420 and the trace layer 430 constitute an electrical substrate. In one embodiment, the ground plane 410 is formed from steel or any other conductive material. The insulating layer 420 may be formed from a polyimide or a dielectric and the trace layer 430 may be formed from copper or any conductive material. The elliptical cross-sectional trace layer 430 may be formed by extrusion. The ground plane 410, insulating layer 420 and trace layer 430 may be coated with a plastic material.

Experiments have shown that such an elliptical cross-sectional trace layer 430 results in reduced distortion of the electrical fields around the interconnecting conductor, as shown in FIG. 5. This leads to reduced electrical breakdown of the transmitted signal. In addition, the resulting interconnecting conductor is less susceptible to kinks, resulting in better mechanical flexibility. As a result, the interconnecting conductor is more durable.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed:

1. An electrical substrate, comprising:

a first conductive layer that has an elliptical cross-section;

a second conductive layer; and, a dielectric layer attached to and located between said first and second conductive layers.

2. The substrate of claim 1, wherein the first conductive layer is made from cooper.

3. The substrate of claim 1, wherein the dielectric layer is polyimide.

4. The substrate of claim 1, wherein the second conductive layer is made from steel.

5. A process for constructing an electrical substrate, comprising:

attaching a first conductive layer onto a dielectric layer, said first conductive layer having an elliptical cross section;

attaching a second conductive layer onto a second side of the dielectric layer.

6. A hard disk drive, comprising:

a housing;

a spin motor mounted to said housing;

an actuator arm mounted to said spin motor, said actuator arm having a voice coil motor;

a disk attached to said spin motor, said disk having at least one side;

a read/write head mounted to said actuator arm for reading said at least one side of said disk;

a flexible circuit attached to said read/write head and said voice coil motor, said flexible circuit comprising a dielectric layer; and a first conductive layer attached to said dielectric layer, said first conductive layer having an elliptical cross-section.

7. The hard disk drive of claim 6, wherein the dielectric layer of the flexible circuit is a polyimide.

8. The hard disk drive of, claim 6, wherein said flexible circuit further comprising a second conductive layer that is attached to the dielectric layer.

9. The hard disk drive of claim 8, wherein the dielectric layer is between said first and said second conductive layers.

10. The hard disk drive of claim 8, wherein the second conductive layer of the flexible circuit is made from steel.

11. The hard disk drive of claim 6, wherein the first conductive layer of the flexible circuit is made from copper.

* * * * *